United States Patent
Mears et al.

(10) Patent No.: US 7,612,366 B2
(45) Date of Patent: *Nov. 3, 2009

(54) SEMICONDUCTOR DEVICE INCLUDING A STRAINED SUPERLATTICE LAYER ABOVE A STRESS LAYER

(75) Inventors: Robert J. Mears, Wellesley, MA (US); Scott A. Kreps, Waltham, MA (US)

(73) Assignee: MEARS Technologies, Inc., Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/457,256

(22) Filed: Jul. 13, 2006

(65) Prior Publication Data

US 2007/0007508 A1    Jan. 11, 2007

Related U.S. Application Data

(63) Continuation-in-part of application No. 11/042,270, filed on Jan. 25, 2005, now Pat. No. 7,435,988, and a continuation-in-part of application No. 10/941,062, filed on Sep. 14, 2004, now Pat. No. 7,279,701, and a continuation-in-part of application No. 10/940,594, filed on Sep. 14, 2004, now Pat. No. 7,288,457, which is a continuation-in-part of application No. 10/647,069, filed on Aug. 22, 2003, now Pat. No. 6,897,472, which is a continuation of application No. 10/603,621, filed on Jun. 26, 2003, now abandoned, which is a continuation of application No. 10/603,696, filed on Jun. 26, 2003, now abandoned.

(60) Provisional application No. 60/699,949, filed on Jul. 15, 2005.

(51) Int. Cl.
*H01L 29/06* (2006.01)
*H01L 31/0328* (2006.01)
*H01L 31/072* (2006.01)

(52) U.S. Cl. .............................. 257/20; 257/18; 257/19; 257/24; 257/27; 257/E29.056

(58) Field of Classification Search ............. 257/18–20, 257/24, 27, E29.056, E29.072

See application file for complete search history.

(56) References Cited

U.S. PATENT DOCUMENTS 4,485,128 A    11/1984    Dalal et al. ................... 427/85

(Continued)

FOREIGN PATENT DOCUMENTS

EP    0 843 361    5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Shouxiang Hu
(74) *Attorney, Agent, or Firm*—Allen, Dyer, Doppelt, Milbrath & Gilchrist, P.A.

(57) ABSTRACT

A semiconductor device may include a stress layer and a strained superlattice layer above the stress layer and including a plurality of stacked groups of layers. More particularly, each group of layers of the strained superlattice layer may include a plurality of stacked base semiconductor monolayers defining a base semiconductor portion, and at least one non-semiconductor monolayer constrained within a crystal lattice of adjacent base semiconductor portions.

33 Claims, 11 Drawing Sheets

U.S. PATENT DOCUMENTS

| | | | |
|---|---|---|---|
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |
| 5,021,839 A * | 6/1991 | Yamazaki | 257/20 |
| 5,049,951 A | 9/1991 | Goronkin et al. | 357/4 |
| 5,055,887 A | 10/1991 | Yamazaki | 357/4 |
| 5,081,511 A | 1/1992 | Tehrani et al. | 357/16 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,430,011 A | 7/1995 | Tanaka et al. | 505/193 |
| 5,569,953 A | 10/1996 | Kikkawa et al. | 257/607 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,877,510 A | 3/1999 | Baba et al. | 257/21 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,495,402 B1 | 12/2002 | Yu et al. | 438/149 |
| 6,498,359 B2 | 12/2002 | Schmidt et al. | 257/190 |
| 6,501,092 B1 | 12/2002 | Nikonov et al. | 257/29 |
| 6,521,549 B1 | 2/2003 | Kamath et al. | 438/786 |
| 6,566,679 B2 | 5/2003 | Nikonov et al. | 257/29 |
| 6,600,170 B1 | 7/2003 | Xiang | 257/18 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,756,646 B2 | 6/2004 | Buchanan et al. | 257/410 |
| 6,816,530 B2 | 11/2004 | Capasso et al. | 372/50 |
| 6,825,538 B2 | 11/2004 | Frank et al. | 257/411 |
| 6,891,188 B2 | 5/2005 | Mears et al. | 257/15 |
| 2002/0094003 A1 | 7/2002 | Bour et al. | 372/46 |
| 2002/0195599 A1 | 12/2002 | Yu et al. | 257/18 |
| 2003/0020075 A1 | 1/2003 | Nikonov et al. | 257/79 |
| 2003/0034529 A1 * | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0111699 A1 * | 6/2003 | Wasshuber et al. | 257/414 |
| 2003/0162335 A1 | 8/2003 | Yuki et al. | 438/151 |
| 2003/0215990 A1 | 11/2003 | Fitzgerald et al. | 438/172 |
| 2004/0026765 A1 | 2/2004 | Currie et al. | 257/616 |
| 2004/0084781 A1 | 5/2004 | Ahn et al. | 257/777 |
| 2004/0227165 A1 | 11/2004 | Wang et al. | 257/222 |
| 2004/0266045 A1 | 12/2004 | Mears et al. | 438/47 |
| 2005/0051795 A1 | 3/2005 | Arena et al. | 257/183 |
| 2005/0054175 A1 | 3/2005 | Bauer | 438/404 |
| 2005/0095807 A1 | 5/2005 | Xiang | 438/424 |
| 2005/0124170 A1 | 6/2005 | Pelella et al. | 438/778 |
| 2005/0142768 A1 | 6/2005 | Lindert et al. | 438/285 |
| 2005/0145894 A1 | 7/2005 | Chau et al. | 257/288 |
| 2005/0173697 A1 | 8/2005 | Mears et al. | 257/28 |
| 2005/0211982 A1 | 9/2005 | Lei et al. | 257/65 |
| 2005/0224800 A1 | 10/2005 | Lindert et al. | 257/66 |
| 2005/0247926 A1 | 11/2005 | Sun et al. | 257/19 |
| 2005/0263753 A1 | 12/2005 | Pelella et al. | 257/18 |
| 2007/0012909 A1 * | 1/2007 | Mears et al. | 257/15 |
| 2007/0012912 A1 * | 1/2007 | Mears et al. | 257/18 |
| 2007/0063185 A1 * | 3/2007 | Rao | 257/18 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| JP | 05283679 | 10/1993 |
| TW | 200409201 | 7/2004 |
| WO | 99/63580 | 12/1999 |
| WO | 02/103767 | 12/2002 |
| WO | WO2004010485 | 1/2004 |
| WO | WO2004038778 | 5/2004 |
| WO | WO2005013371 | 2/2005 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

Hill et al., *Low-Pressure Rapid Thermal Chemical Vapor Deposition of Oxynitride Gate Dielectrics for N-Channel and P-Channel MOSFETS*, IEE Transactions on Electron Devices, vol. 43, No. 1, Jan. 1996, pp. 15-22.

Lee et al., *Suppression of Reverse Short Channel Effect by Nitrogenimplantation and its Implications on Nitrogen as s Dopant Species Forapplications in 0.25 MM Technology*, Electron Devices Meeting, 1997 IEEE Hong Kong, Aug. 30, 1997, pp. 61-64.

Mirabedini et al., *A Study of Nitrogen Peak Location in Gate Oxides Grown on Nitrogen Implanted Substrates and its Impact on Boron Penetration*, IEEE Electron Device Letters, vol. 24, No. 5, May 2003, pp. 301-303.

Sasaki et al., *Engineering of Nitrogen Profile in an Ultrathin Gate Insulator to Improve Transistor Performance and NBTI*, IEEE Electron Device Letters, vol. 24, No. 5, Mar. 2003, pp. 150-152.

Lammers, *Intel, TI 'Straining' to Improve 90-nm Silicon*, EETimes Online, Oct. 24, 2003, available at www.eetimes.com.

Krazit, *AMB, IBM Team on Speedier Chips, New Forms of Strained Silicon Bolster 65- Nanometer Chip-Making*, PC World, Dec. 7, 2005, available at www.pcworld.com.

* cited by examiner

SEMICONDUCTOR DEVICE INCLUDING A STRAINED SUPERLATTICE LAYER ABOVE A STRESS LAYER

CROSS-REFERENCE TO RELATED APPLICATIONS

This application claims the benefit of U.S. Provisional Application No. 60/699,949 filed Jul. 15, 2005, and is a continuation-in-part of U.S. patent application Ser. No. 10/941,062 now U.S. Pat. No. 7,279,701 and Ser. No. 10/940,594 now U.S. Pat. No. 7,288,457 filed Sep. 14, 2004, and Ser. No. 11/042,270 filed on Jan. 25, 2005 now U.S. Pat. No. 7,435,988, which, in turn, are a continuation-in-parts of U.S. patent application Ser. No. 10/647,069 filed on Aug. 22, 2003, now U.S. Pat. No. 6,897,472, which is a continuation of U.S. patent application Ser. No. 10/603,621 filed on Jun. 26, 2003 now abandoned, and a continuation of U.S. patent application Ser. No. 10/603,696 filed on Jun. 26, 2003 now abandoned, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements Greater mobility may increase device speed and/or reduce device power consumption. With greater mobility, device performance can also be maintained despite the continued shift to smaller devices and new device configurations

SUMMARY OF THE INVENTION

In view of the foregoing background, it is therefore an object of the present invention to provide a semiconductor device having enhanced operating characteristics.

This and other objects, features, and advantages in accordance with the present invention are provided by a semiconductor device which may include a stress layer and a strained superlattice layer above the stress layer and comprising a plurality of stacked groups of layers. More particularly, each group of layers of the strained superlattice layer may include a plurality of stacked base semiconductor monolayers defining a base semiconductor portion, and at least one non-semiconductor monolayer constrained within a crystal lattice of adjacent base semiconductor portions.

The stress layer may be a graded semiconductor layer, for example. Moreover, the graded semiconductor layer may be graded in a vertical direction, and the strained superlattice may be vertically stacked on the graded semiconductor layer. In addition, the semiconductor device may further include a substantially ungraded semiconductor layer positioned between the graded semiconductor layer and the strained superlattice layer.

By way of example, the stress layer may include graded silicon germanium. The stress layer may also include a plurality of strain inducing pillars arranged in side-by-side relation. An insulating layer may also be positioned between the stress layer and the strained superlattice layer. The semiconductor device may further include regions for causing transport of charge carriers through the strained superlattice layer in a parallel direction relative to the stacked groups of layers Additionally, a semiconductor substrate may be adjacent the stress layer on a side thereof opposite the strained superlattice layer.

Furthermore, the strained superlattice layer may have a compressive or tensile strain. The strained superlattice layer may also have a common energy band structure therein. By way of example, each base semiconductor portion may include a base semiconductor selected from the group consisting of Group IV semiconductors, Group III-V semiconductors, and Group II-VI semiconductors More particularly, each base semiconductor portion may include silicon. Moreover, each non-semiconductor monolayer may include a non-semiconductor selected from the group consisting of oxygen, nitrogen, fluorine, and carbon-oxygen.

Adjacent base semiconductor portions of the strained superlattice layer may be chemically bound together. Furthermore, each non-semiconductor monolayer may be a single monolayer thick, and each base semiconductor portion may be less than eight monolayers thick. The strained superlattice layer may further include a substantially direct energy bandgap. The strained superlattice layer may also include a base semiconductor cap layer on an uppermost group of layers. In some embodiments, all of the base semiconductor portions may be a same number of monolayers thick. Alternatively, at least some of the base semiconductor portions may be a different number of monolayers thick.

DETAILED DESCRIPTION OF THE PREFERRED EMBODIMENTS

Figure 1:
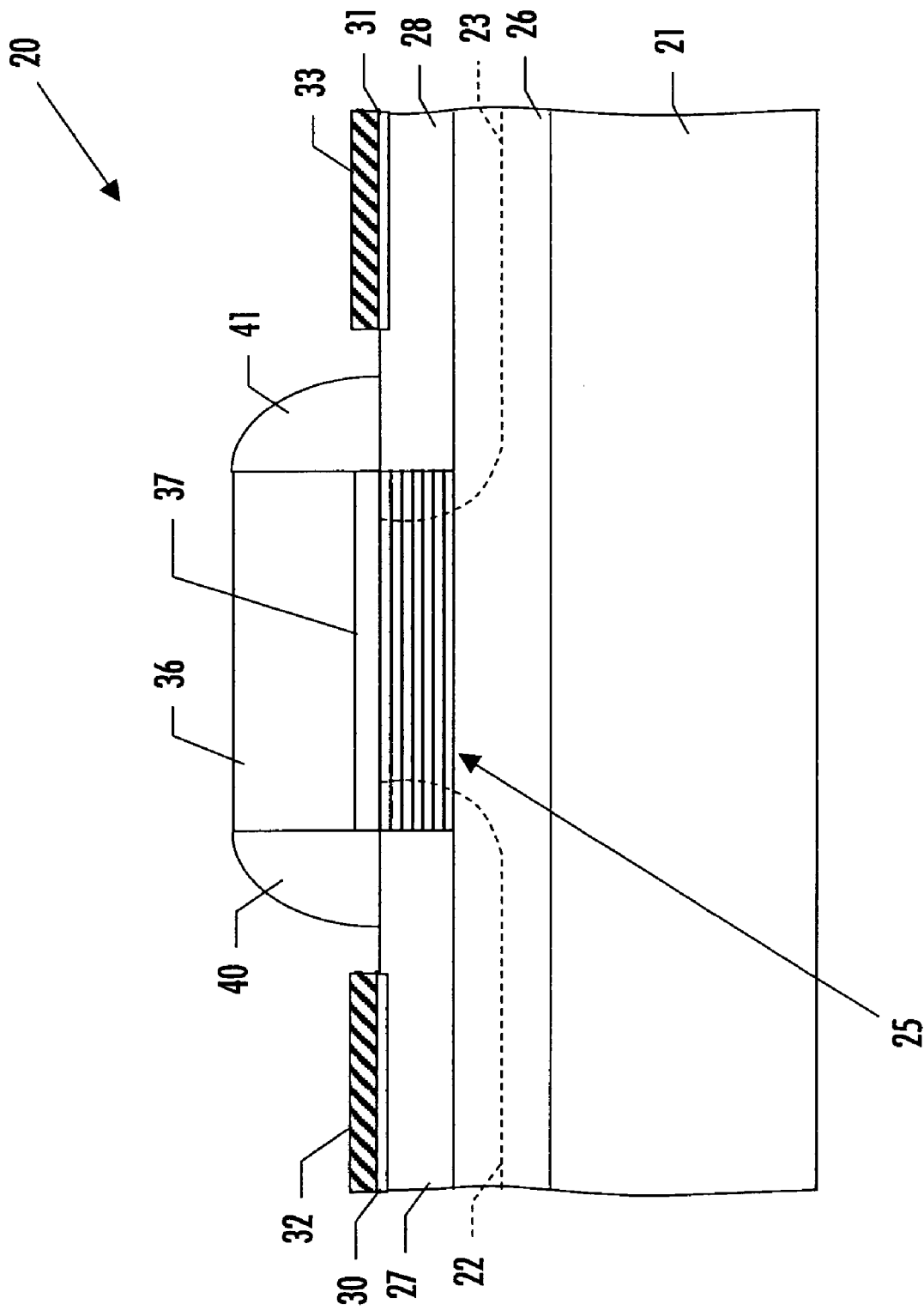
FIG. 1 is a schematic cross-sectional view of a semiconductor device in accordance with the present invention including a stress layer and a strained superlattice above the stress layer.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices Applicants theorize, without wishing to be bound thereto, that certain superlattices as described herein reduce the effective mass of charge carriers and that this thereby leads to higher charge carrier mobility Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{BZ} f(E(k,n), E_F, T) d^3k}$$

for electrons and:

$$M_{h,i,j}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{BZ} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a strained superlattice 25 material for a channel region in a MOSFET device. A planar MOSFET 20 including the strained superlattice 25 in accordance with the invention is now first described with reference to FIG. 1. One skilled in the art, however, will appreciate that the materials identified herein could be used in many different types of semiconductor devices, such as discrete devices and/or integrated circuits. By way of example, another application in which the strained superlattice 25 may be used is in FIN-FETs, as further described in U.S. application Ser. No. 11/426,969, which is assigned to the present Assignee and is hereby incorporated herein in its entirety by reference.

The illustrated MOSFET 20 includes a substrate 21, a stress layer 26 on the substrate, semiconductor regions 27, 28 on the stress layer, and the strained superlattice layer 25 is on the stress layer between the semiconductor regions. More particularly, the stress layer 26 may be a graded semiconductor layer, such as a graded silicon germanium layer. Moreover, the semiconductor regions 26, 27 may be silicon or silicon germanium regions, for example The semiconductor regions 26, 27 are illustratively implanted with a dopant to provide source and drain regions 22, 23 of the MOSFET 20, as will be appreciated by those skilled in the art.

Various superlattice structures that may be used in the MOSFET 20 are discussed further below. In the case of a silicon-oxygen superlattice, the lattice spacing of the superlattice layer 25 would ordinarily be smaller than that of a silicon germanium stress layer 26. However, the stress layer 26 in this example induces a tensile strain in the superlattice layer 25, which may be used to provide further mobility enhancement in N-channel FETs, for example Alternatively, the compositions of the superlattice layer 25 and stress layer 26 may be chosen so that the superlattice would otherwise have a larger lattice spacing than the stress layer. This would advantageously induce compressive strain in the superlattice layer 25 that may advantageously provide further mobility enhancement of the superlattice in P-channel FET devices, for example.

Figure 6:
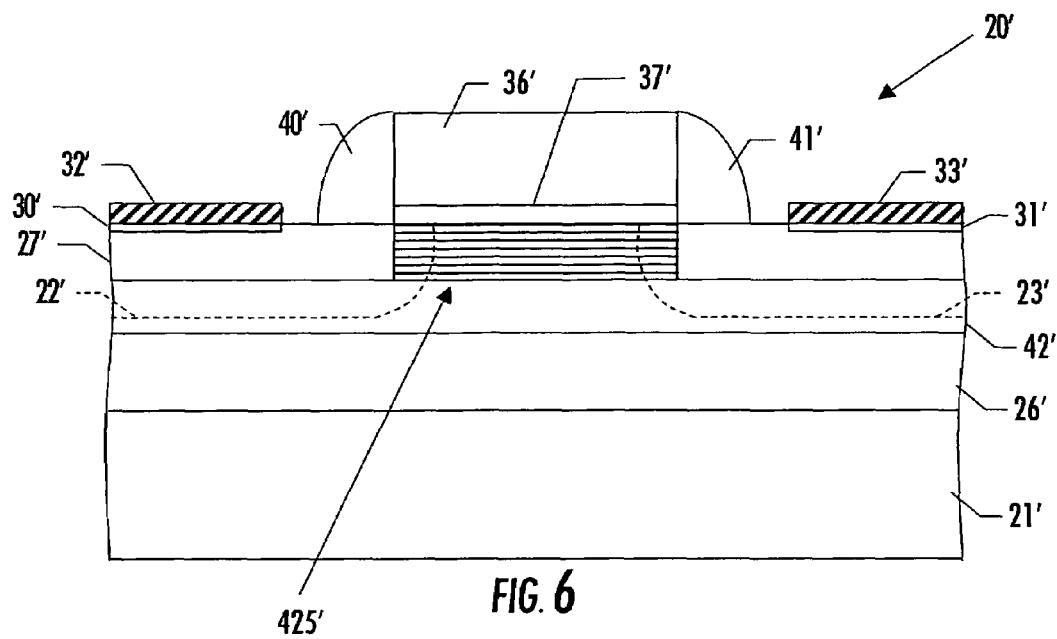
FIGS. 6 and 7 are schematic cross-sectional views of alternative embodiments of the semiconductor device of FIG. 1.

In the illustrated embodiment, the stress layer is a graded semiconductor layer graded in a vertical direction, and the strained superlattice 25 is vertically stacked on the graded semiconductor layer. In an alternative embodiment illustrated in FIG. 6, the MOSFET 20' further includes a substantially ungraded semiconductor layer 42' positioned between the graded semiconductor layer 26' and a strained superlattice layer 425'. That is, the substantially ungraded semiconductor layer 42' has a substantially consistent composition of semiconductor material (e.g., silicon germanium) throughout from top to bottom and provides a buffer between the stress layer 26' and the superlattice layer 425'. More particularly, the substantially ungraded semiconductor layer 42' may have substantially the same composition as the semiconductor material at the top of the stress layer 42'. Further information on the use of graded and ungraded layers for straining an overlying semiconductor layer (e.g., silicon) may be found in U.S. Patent Publication Nos. 2005/0211982 to Lei et al, 2005/0054175 to Bauer, 2005/0224800 to Lindert et al., and 2005/0051795 to Arena et al., all of which are hereby incorporated herein in their entireties by reference.

Source/drain silicide layers 30, 31 and source/drain contacts 32, 33 illustratively overlie the source/drain regions 22, 23, as will be appreciated by those skilled in the art. A gate 35 illustratively includes a gate insulating layer 37 adjacent the channel provided by the strained superlattice layer 25r and a gate electrode layer 36 on the gate insulating layer. Sidewall spacers 40, 41 are also provided in the illustrated MOSFET 20.

It is also theorized that the semiconductor device, such as the illustrated MOSFET 20, enjoys a higher charge carrier mobility based upon the lower conductivity effective mass than would otherwise be present. In some embodiments, and as a result of the band engineering, the superlattice 25 may further have a substantially direct energy bandgap that may be particularly advantageous for opto-electronic devices, for example, such as those set forth in the co-pending application entitled INTEGRATED CIRCUIT COMPRISING AN ACTIVE OPTICAL DEVICE HAVING AN ENERGY BAND ENGINEERED SUPERLATTICE, U.S. patent application Ser. No. 10/936,903, which is assigned to the present Assignee and is hereby incorporated herein in its entirety by reference.

As will be appreciated by those skilled in the art, the source/drain regions 22, 23 and gate 35 of the MOSFET 20 may be considered as regions for causing the transport of charge carriers through the strained superlattice layer 25 in a parallel direction relative to the layers of the stacked groups 45a-45n, as will be discussed further below. That is, the channel of the device is defined within the superlattice 25. Other such regions are also contemplated by the present invention.

In certain embodiments, the superlattice 25 may advantageously act as an interface for the gate dielectric layer 37. For example, the channel region may be defined in the lower portion of the superlattice 25 (although some of the channel may also be defined in the semiconductor material below the superlattice), while the upper portion thereof insulates the channel from the dielectric layer 37. In still another embodiment, the channel may be defined solely in the stress layer 26, and the strained superlattice layer 25 may be included merely as an insulation/interface layer.

Use of the superlattice 25 as a dielectric interface layer may be particularly appropriate where relatively high-K gate dielectric materials are used. The superlattice 25 may advantageously provide reduced scattering and, thus, enhanced mobility with respect to prior art insulation layers (e.g., silicon oxides) typically used for high-K dielectric interfaces. Moreover, use of the superlattice 25 as an insulator for applications with high-K dielectrics may result in smaller overall thicknesses, and thus improved device capacitance. This is because the superlattice 25 may be formed in relatively small thicknesses yet still provide desired insulating properties, as discussed further in co-pending U.S. application Ser. No.

11/136,881, which is assigned to the present Assignee and is hereby incorporated herein in its entirety by reference.

Applicants have identified improved materials or structures for the channel region of the MOSFET 20. More specifically, the Applicants have identified materials or structures having energy band structures for which the appropriate conductivity effective masses for electrons and/or holes are substantially less than the corresponding values for silicon.

Figure 2:
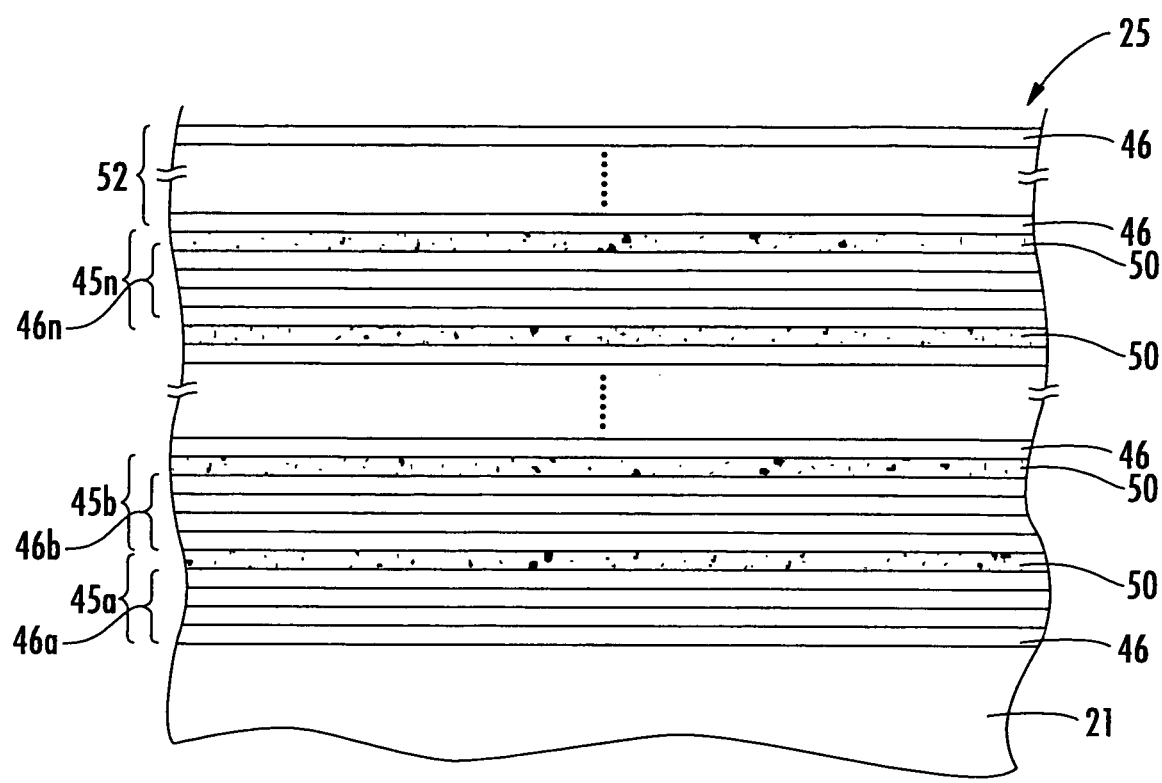
FIG. 2 is a greatly enlarged schematic cross-sectional view of the superlattice as shown in FIG. 1.
Figure 3:
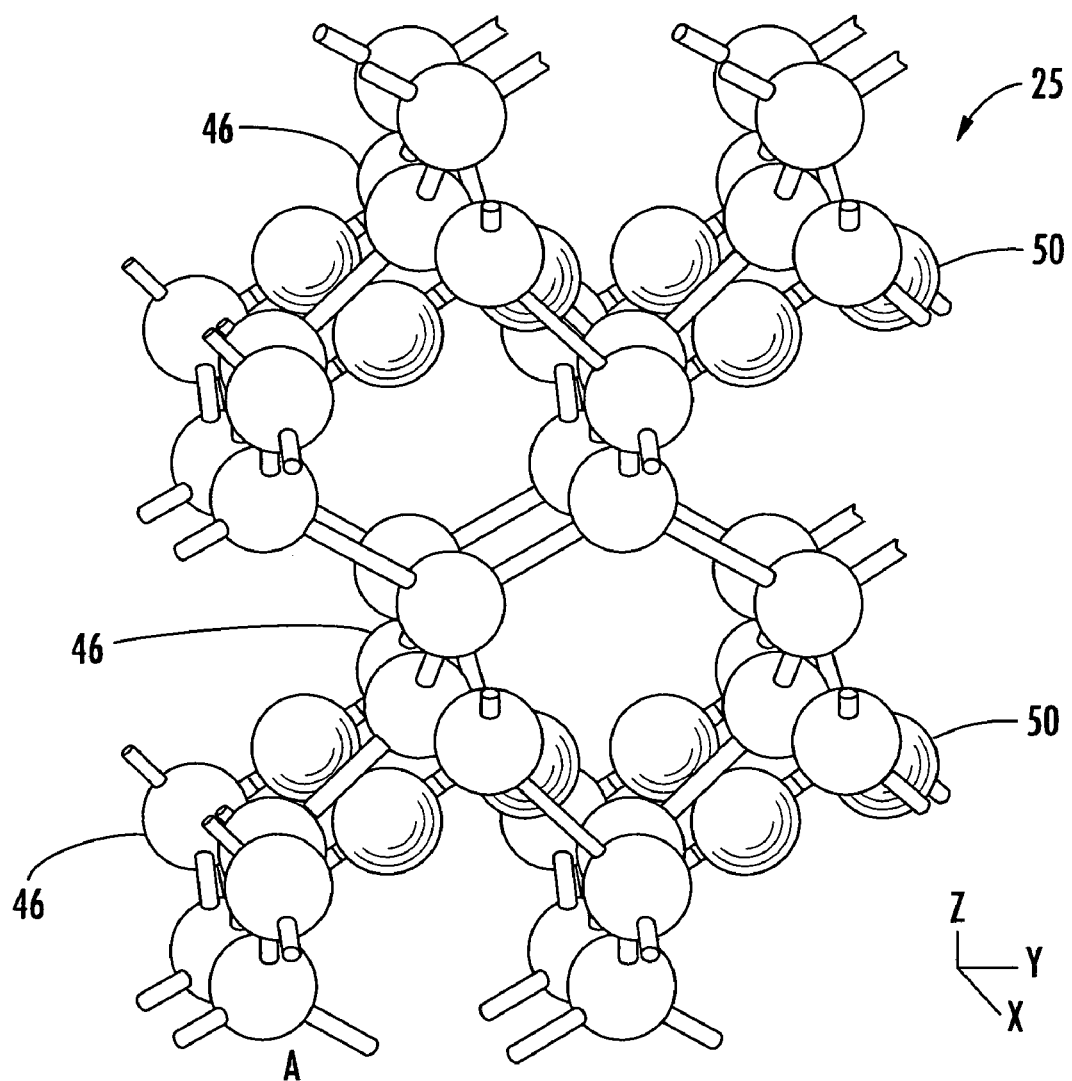
FIG. 3 is a perspective schematic atomic diagram of a portion of the superlattice shown in FIG. 1.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 2. Moreover, an intermediate annealing process as described in co-pending U.S. application Ser. No. 11/136,834, which is assigned to the present Assignee and is hereby incorporated herein in its entirety by reference, may also be used to advantageously reduce defects and provide smoother layer surfaces during fabrication.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 2 for clarity of explanation.

The energy-band modifying layer 50 illustratively comprises one non-semiconductor monolayer constrained within a crystal lattice of adjacent base semiconductor portions. That is, opposing base semiconductor monolayers 46 in adjacent groups of layers 45a-45n are chemically bound together For example, in the case of silicon monolayers 46, some of the silicon atoms in the upper or top semiconductor monolayer of the group of monolayers 46a will be covalently bonded with silicon atoms in the lower or bottom monolayer of the group 46b, as seen in FIG. 3. This allows the crystal lattice to continue through the groups of layers despite the presence of the non-semiconductor monolayer(s) (e.g., oxygen monolayer(s)) Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

In some embodiments, more than one non-semiconductor monolayer may be present in the energy band modifying layer 50. By way of example, the number of non-semiconductor monolayers in the energy band-modifying layer 50 may preferably be less than about five monolayers to thereby provide the desired energy band-modifying properties.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied, as noted above. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case, as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 may be readily adopted and implemented as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. Of course, more than seven silicon layers may be used in some embodiments. The 4/1 repeating structure shown in FIGS. 2 and 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art. It may be especially appropriate to dope at least a portion of the superlattice 25 if the superlattice is to provide some or all of the channel However, the superlattice 25 or portions thereof may also remain substantially undoped in some embodiments, as described further in U.S. application Ser. No. 11/136,757, which is assigned to the present Assignee and is hereby incorporated herein in its entirety by reference.

Figure 4:
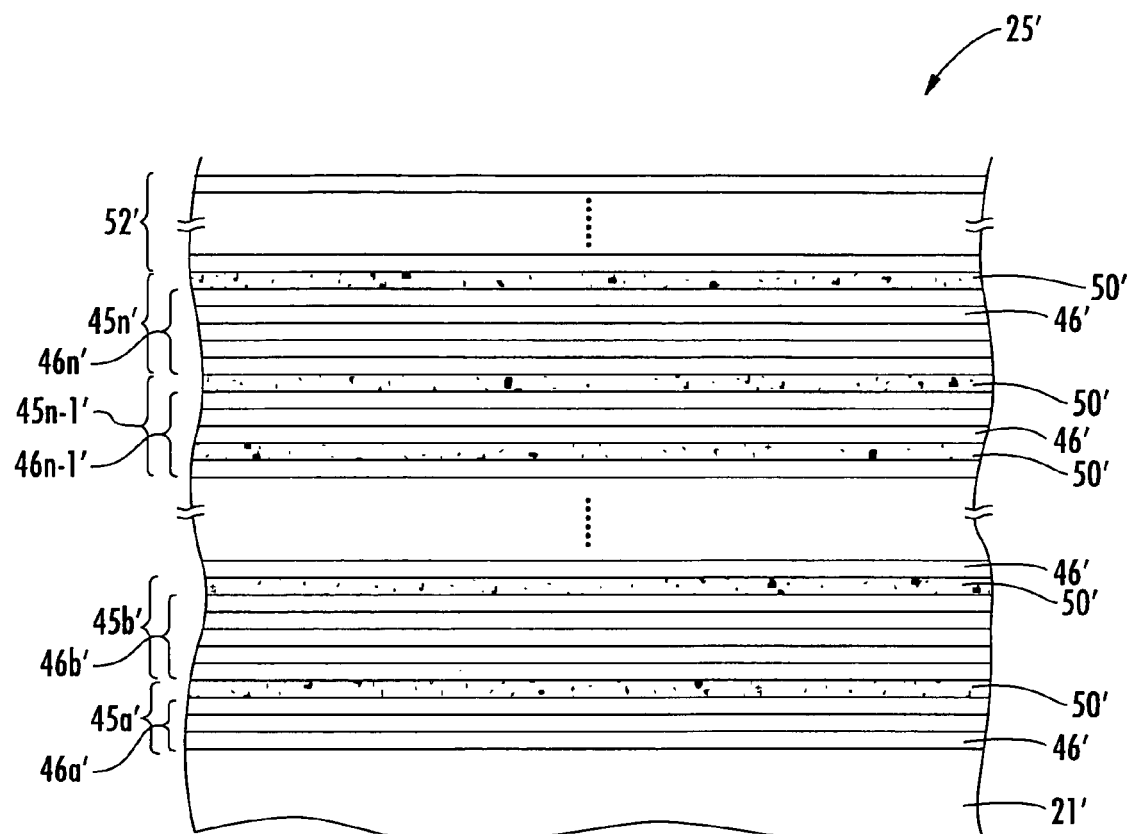
FIG. 4 is a greatly enlarged schematic cross-sectional view of another embodiment of a superlattice that may be used in the device of FIG. 1.

Referring now additionally to FIG. 4, another embodiment of a superlattice 25' in accordance with the invention having different properties is now described. In this embodiment, a repeating pattern of 3/1/5/1 is Illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 5A:
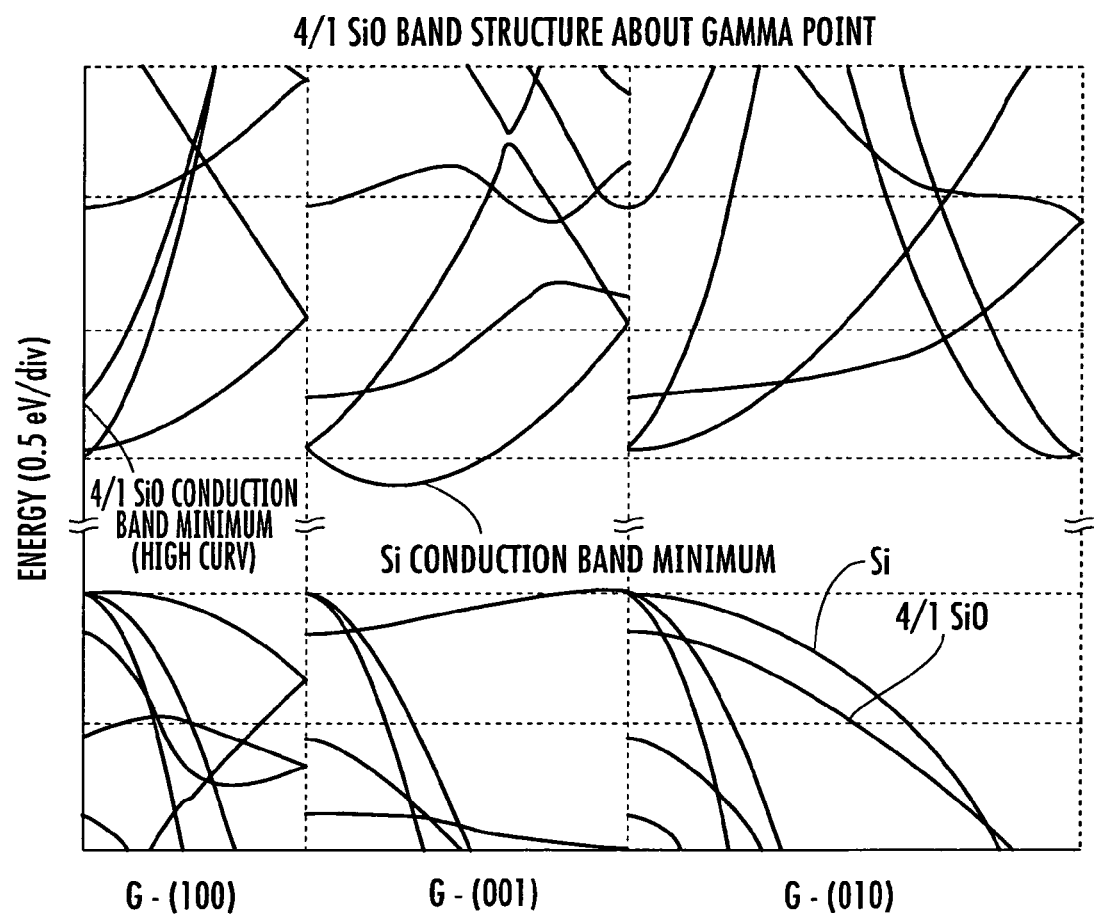
FIG. 5A is a graph of the calculated band structure from the gamma point (G) for both bulk silicon as in the prior art, and for the 4/1 Si/O superlattice as shown in FIGS. 1-3.
Figure 5B:
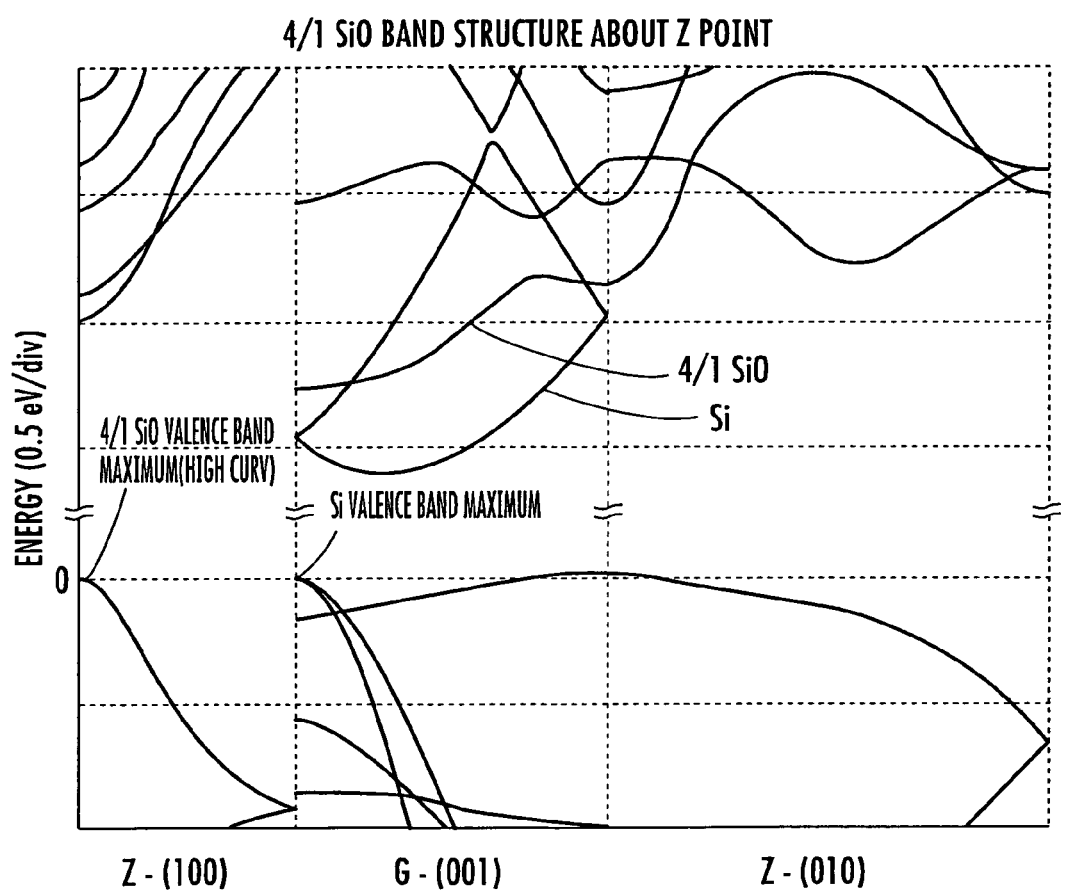
FIG. 5B is a graph of the calculated band structure from the Z point for both bulk silicon as in the prior art, and for the 4/1 Si/O superlattice as shown in FIGS. 1-3.
Figure 5C:
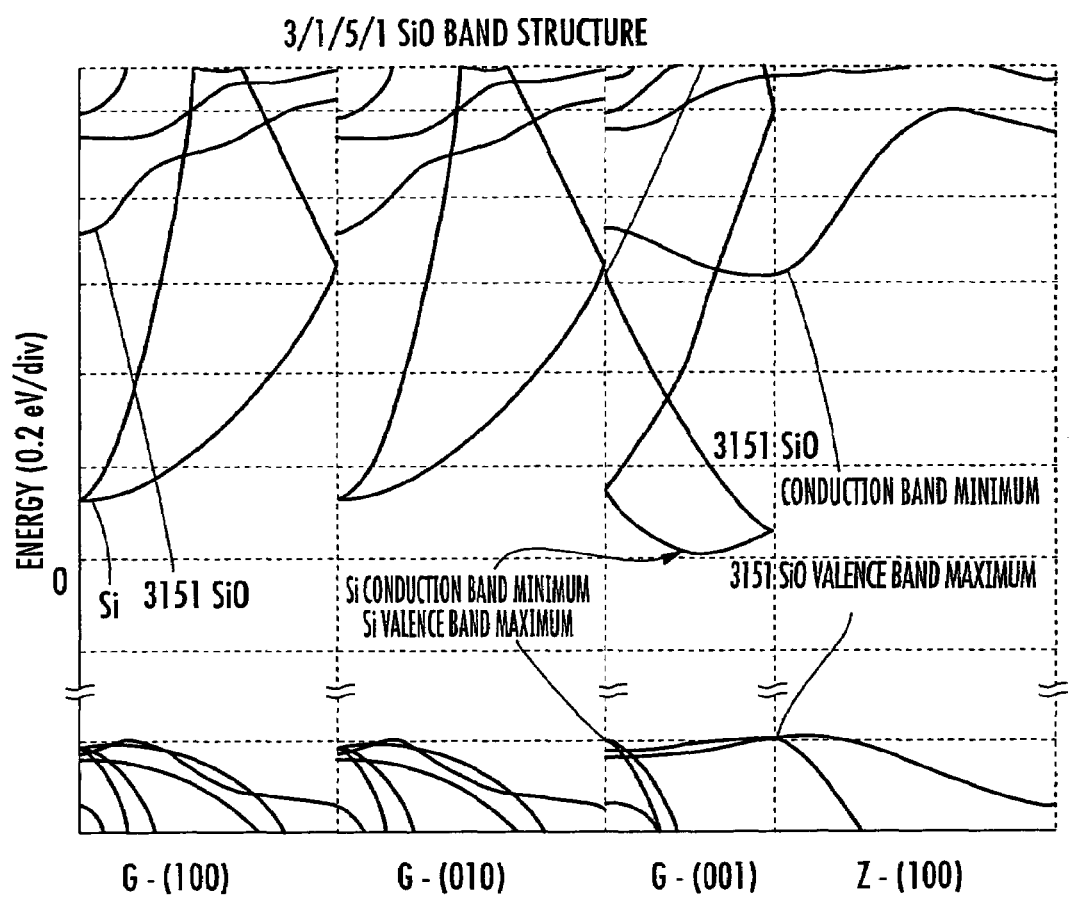
FIG. 5C is a graph of the calculated band structure from both the gamma and Z points for both bulk silicon as in the prior art, and for the 5/1/3/1 Si/O superlattice as shown in FIG. 4.

In FIGS. 5A-5C band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIGS. 1-3 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer FIG. 5B shows the calculated band structure from the Z point for both bulk silicon (continuous lines) and for the 4/1 Si/O superlattice 25 (dotted lines). This figure illustrates the enhanced curvature of the valence band in the (100) direction FIG. 5C shows the calculated band structure from the both the gamma and Z point for both bulk silicon (continuous lines) and for the 5/1/3/1 Si/O structure of the superlattice 25' of FIG. 4 (dotted lines) Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 7:
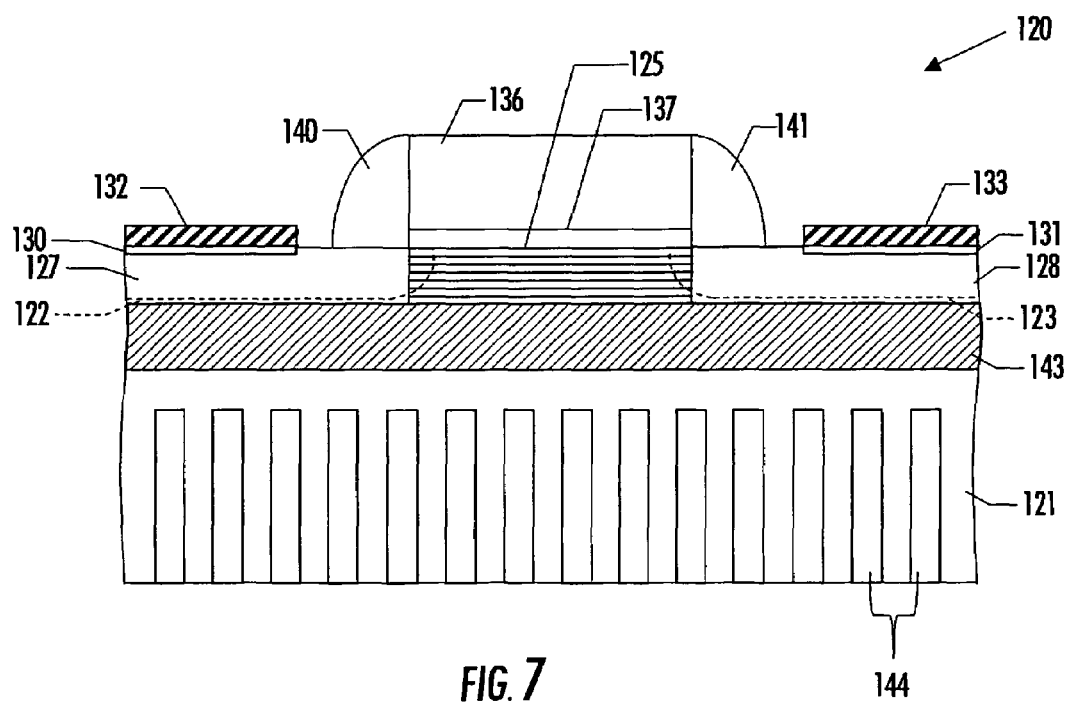
Figure 8:
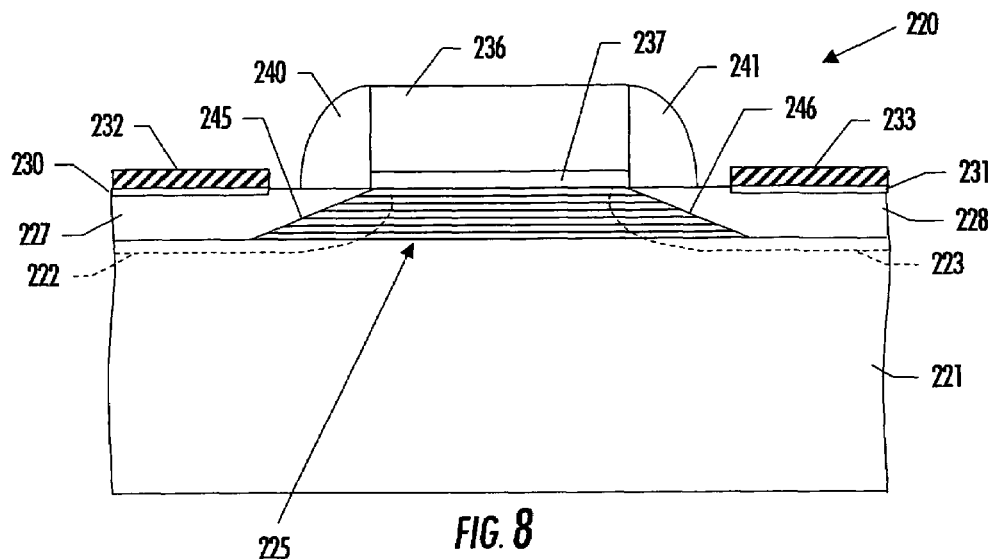
FIG. 8 is a schematic cross-sectional view of another semiconductor device embodiment in accordance with the present invention including a superlattice between a pair of spaced apart stress regions
Figure 9:
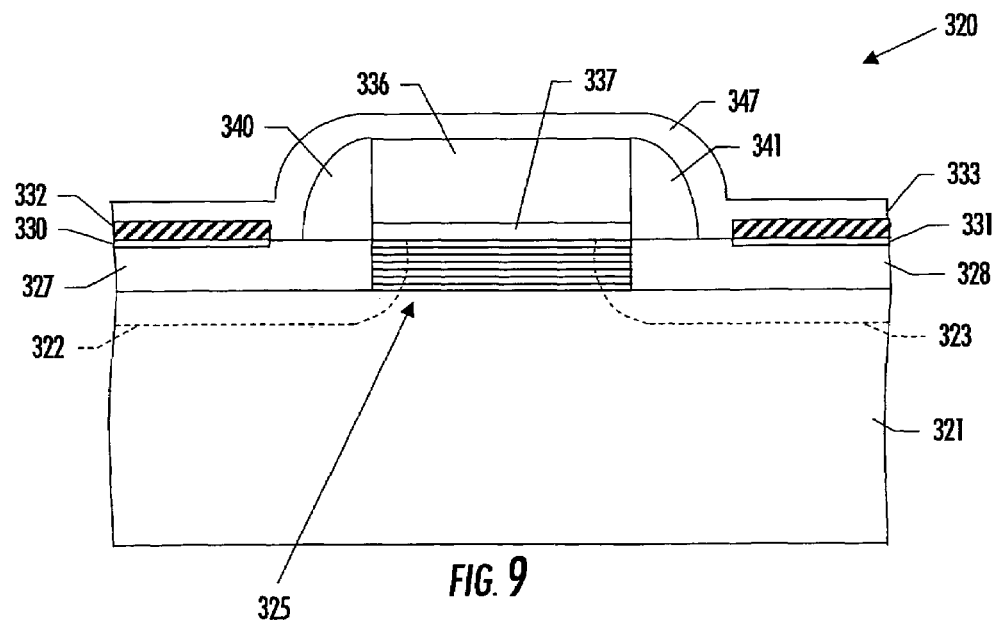
FIG. 9 is a schematic cross-sectional view of yet another semiconductor device embodiment in accordance with the present invention including a superlattice and a stress layer above the superlattice.

Turning additionally to FIGS. 7-9, additional embodiments of MOSFETs 120, 220, and 320 each including a strained superlattice layer are now described. In the illustrated embodiments, the various layers and regions that are similar to those discussed above with reference to FIG. 1 are represented by increments of one hundred (e.g., the substrates 121, 221, and 321 shown in FIGS. 7-9, respectively, are similar to the substrate 21), In the MOSFET 120, the stress layer is provided by a plurality of spaced apart strain inducing pillars 144 arranged in side-by-side relation on the backside (i.e., bottom) of the substrate 121. By way of example, if compressive strain is desired then the pillars 144 may include plasma enhanced chemical vapor deposition (PECVD) silicon nitride (SiN), metal, or other materials which become compressed upon or after being deposited in trenches etched in the backside of the substrate 121. Moreover, if tensile strain is desired then the pillars may include a thermally formed SiN material or low pressure chemical vapor deposition (LPCVD) SiN material, for example. Of course, other suitable materials known to those skilled in the art may also be used. Further details on a backside strain-inducing pillar arrangement may be found in U.S. Patent Publication No. 2005/0263753 to Pelella et al., which is hereby incorporated herein in its entirety by reference.

Moreover, an insulating layer 143 (shown with stippling for clarity of illustration), such as an $SiO_2$ layer, may also be positioned between the stress layer 125 and the strained superlattice layer to provide a semiconductor-on-insulator embodiment, as shown, although the insulating layer need not be used in all embodiments Further details on forming a superlattice structure as set forth above on a semiconductor-on-insulator substrate are provided in co-pending U.S. application Ser. No. 11/381,835, which is assigned to the present Assignee and is hereby incorporated herein in its entirety by reference. Of course, semiconductor-on-insulator implementations may be used in other embodiments discussed herein as well.

Referring to FIG. 8, in the MOSFET 220 the regions 327, 328 define a pair of spaced apart stress regions for inducing strain in the superlattice layer 125 positioned therebetween. More particularly, one or both of the stress regions may include a material that induces a desired strain on the superlattice layer 225. Using the above-noted example, for a silicon-oxygen superlattice layer 225 one or both of the regions 227, 228 may include silicon germanium. Yet, whereas in the MOSFET 20 the silicon germanium induced a tensile strain when positioned below the superlattice layer 25, when positioned on one or both sides of the superlattice layer 225 the silicon germanium has the opposite effect and compresses the superlattice.

Thus, in the illustrated embodiment silicon germanium in the stress regions 227, 228 would be advantageous for P-channel implementations because it induces compressive strain. Alternatively, a tensile strain could advantageously be induced in the superlattice layer 225 for N-channel devices by properly selecting the composition of the superlattice and the stress regions 227, 228, as discussed above. It should be noted that in some embodiments the spaced apart stress regions 227, 228 need not include the same materials. That is, strain may be induced as one stress region "pushes" or "pulls" against the other which serves as an anchor In the above-described embodiment, the pair of stress regions 227, 228 are doped to provide the source and drain regions 222, 223. Moreover, the stress regions 227, 228 illustratively include canted surfaces or facets 245, 246 adjacent opposing portions of the strained superlattice. The canted surfaces 245, 246 may result from the etching process used to pattern the superlattice 225 so that the stress inducing material can be deposited adjacent thereto. However, the surfaces 245, 246 need not be canted in all embodiments Further details on making strained channel devices with strain-inducing source and drain regions are disclosed in U.S. Pat. No. 6,495,402 to Yu et al. and U.S. Patent Publication No. 2005/0142768 to Lindert et al., both of which are hereby incorporated herein in their entireties by reference.

Referring to FIG. 9, the MOSFET 320 illustratively includes a stress layer 347 above the strained superlattice layer 325. By way of example, the stress layer may be a SiN layer deposited over the source, drain, and gate regions of the MOSFET 320 that induces a strain in the underlying semiconductor material, including the superlattice layer 325. As noted above, a tensile or compressive nitride material may be used depending upon the type of strain desired in the superlattice layer 325. Of course, other suitable materials may also be used for the stress layer 347, and multiple stress layers may be used in some embodiments. Moreover, in certain embodiments the superlattice layer 325 may "memorize" the strain induced from the overlying stress layer 347, and the stress layer may thereafter be removed, as will be appreciated by those skilled in the art. Further details on creating strain in semiconductor regions using overlying stress layers may be found in U.S. Patent Publication Nos. 2005/0145894 to Chau et al. and 2005/0247926 to Sun et al., both of which are hereby incorporated herein in their entireties by reference.

A first method aspect in accordance with the invention for making a semiconductor device, such as the MOSFET 20, is now described. The method includes forming a stress layer 26, and forming a strained superlattice layer 25 above the stress layer. Another method aspect is for making a semiconductor device, such as the MOSFET 220, which includes forming a superlattice layer 225, and forming at least one pair of spaced apart stress regions 227, 228 on opposing sides of the superlattice layer to induce a strain therein. Still another method aspect is for making a semiconductor device, such as the MOSFET 320, which includes forming a superlattice layer 325, and forming a stress layer 347 above the strained superlattice layer to induce a strain therein. Various other method steps and aspects will be appreciated by those skilled in the art from the foregoing description and therefore require no further discussion herein.

It should be noted that in the above-described embodiments, the strained layer need not always be a superlattice 25. Rather, the strained layer may simply include a plurality of base semiconductor portions 46a-46n, and one or more non-semiconductor monolayers 50 constrained within a crystal lattice of adjacent base semiconductor portions (i.e., the adjacent base semiconductor portions are chemically bound together, as described above). In this embodiment, the base semiconductor portions 46a-46n need not include a plurality of semiconductor monolayers, i.e., each semiconductor portion could include a single layer or a plurality of monolayers, for example.

Figure 10:
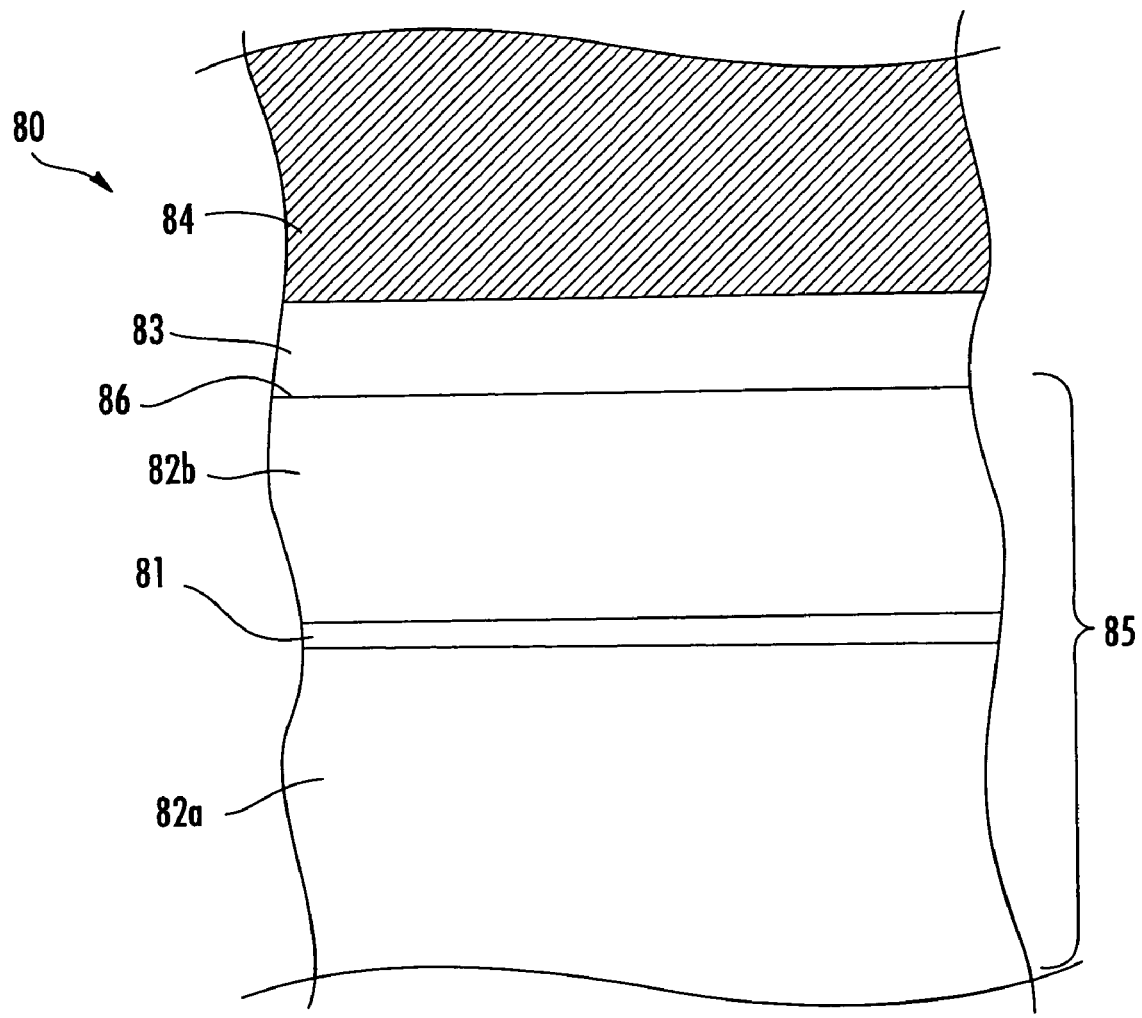
FIG. 10 is a schematic cross-sectional view of a MOSFET including a non-semiconductor monolayer in accordance with the present invention.

A MOSFET 80 illustratively including a non-semiconductor monolayer 81 is schematically shown in FIG. 10 wherein the semiconductor monolayers are in the portions 82a, 82b respectively below and above the non-semiconductor monolayer. The gate dielectric 83 is illustratively above the channel 85, and the gate electrode 84 is above the gate dielectric. The region between the lower portion of the gate dielectric 83 and the upper portion of the channel 85 define an interface 86. The source and drain (not shown) would be positioned laterally adjacent the channel 85, as will be appreciated by those skilled in the art.

The depth of the monolayer of non-semiconductor material 81 from the interface 86 may be selected based upon the MOSFET design, as will be appreciated by those skilled in the art. For example, a depth of about 4-100 monolayers, and more preferably a depth of about 4-30 monolayers, may be selected for a typical MOSFET 86 for an oxygen layer in a silicon channel. The at least one monolayer of non-semiconductor material may include one or more monolayers that are not fully populated in all of the available sites as described above.

As discussed above, the non-semiconductor may be selected from the group consisting of oxygen, nitrogen, fluorine, and carbon-oxygen, for example. The at least one monolayer of non-semiconductor material 81 may be deposited using atomic layer deposition techniques, for example, as also described above and as will be appreciated by those skilled in the art. Other deposition and/or implantation methods may also be used to form the channel 85 to include the at least one non-semiconductor material layer 81 within the crystal lattice of adjacent semiconductor layers 82a, 82b.

Figure 11:
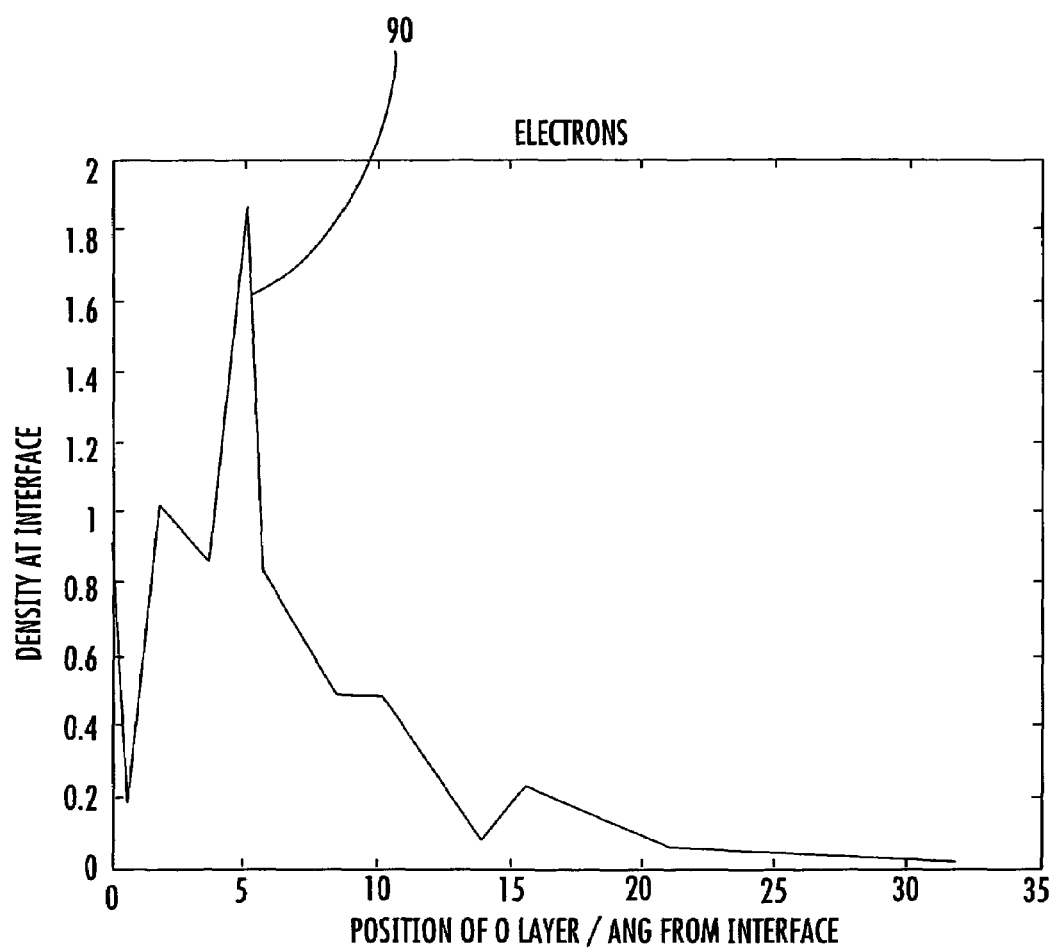
FIG. 11 is a simulated plot of density at the interface versus depth for the non-semiconductor monolayer of FIG. 10.

A simulated plot 90 of density at the interface versus depth of an oxygen layer in Angstroms is shown in FIG. 11. As will be appreciated by those skilled in the art, in embodiments such as the illustrated MOSFET 80, repeating groups of the superlattice need not be used, yet the at least one non-semiconductor monolayer 81 may still provide enhancement to mobility. In addition, Applicants also theorize without wishing to be bound thereto that these embodiments will also have lower tunneling gate leakage as a result of the reduced magnitude of the wave functions at the interface 86. It is also theorized that further desirable features of these embodiments include increased energy separation between sub-bands, and the spatial separation of sub-bands, thereby reducing sub-band scattering.

Of course in other embodiments, the at least one monolayer 81 may also be used in combination with an underlying superlattice as will also be appreciated by those skilled in the art. Further, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended.

That which is claimed is:

1. A semiconductor device comprising:
   a stress layer;
   a strained superlattice layer above said stress layer and comprising a plurality of stacked groups of layers;
   each group of layers of said strained superlattice layer comprising a plurality of stacked base semiconductor monolayers defining a base semiconductor portion and a single non-semiconductor monolayer constrained within a crystal lattice of adjacent base semiconductor portions from among the plurality of base semiconductor portions, wherein not all of the possible sites for non-semiconductor atoms in the single non-semiconductor monolayer are occupied by non-semiconductor atoms; and
   non-superlattice regions for causing transport of charge carriers through said strained superlattice layer in a parallel direction relative to the stacked groups of layers, said non-superlattice regions comprising source and drain regions with said strained superlattice layer therebetween.

2. The semiconductor device of claim 1 wherein said stress layer comprises a graded semiconductor layer.

3. The semiconductor device of claim 2 wherein said graded semiconductor layer is graded in a vertical direction; and wherein said strained superlattice is vertically stacked on said graded semiconductor layer.

4. The semiconductor device of claim 2 further comprising a substantially ungraded semiconductor layer positioned between said graded semiconductor layer and said strained superlattice layer.

5. The semiconductor device of claim 2 wherein said graded semiconductor layer comprises graded silicon germanium.

6. The semiconductor device of claim 1 wherein said stress layer comprises a plurality of strain inducing pillars.

7. The semiconductor device of claim 1 further comprising an insulating layer positioned between said stress layer and said strained superlattice layer.

8. The semiconductor device of claim 1 further comprising a semiconductor substrate adjacent said stress layer on a side thereof opposite said strained superlattice layer.

9. The semiconductor device of claim 1 wherein said strained superlattice layer has a compressive strain.

10. The semiconductor device of claim 1 wherein said strained superlattice layer has a tensile strain.

11. The semiconductor device of claim 1 wherein said strained superlattice layer has a common energy band structure therein.

12. The semiconductor device of claim 1 wherein each of said base semiconductor portions comprises silicon.

13. The semiconductor device of claim 1 wherein each of said base semiconductor portions comprises a base semiconductor selected from the group consisting of Group IV semiconductors, Group III-V semiconductors, and Group II-VI semiconductors.

14. The semiconductor device of claim 1 wherein each of said non-semiconductor monolayers comprises oxygen.

15. The semiconductor device of claim 1 wherein each of said non-semiconductor monolayers comprises a non-semiconductor selected from the group consisting of oxygen, nitrogen, fluorine, and carbon-oxygen.

16. The semiconductor device of claim 1 wherein each of said base semiconductor portions is less than eight monolayers thick.

17. The semiconductor device of claim 1 wherein said strained superlattice layer further has a substantially direct energy bandgap.

18. The semiconductor device of claim 1 wherein said strained superlattice layer further comprises a base semiconductor cap layer on an uppermost group of layers.

19. The semiconductor device of claim 1 wherein all of said base semiconductor portions are a same number of monolayers thick.

20. The semiconductor device of claim 1 wherein at least some of said base semiconductor portions are a different number of monolayers thick.

21. A semiconductor device comprising:
   a stress layer comprising a semiconductor graded in a vertical direction;
   a strained superlattice layer comprising a plurality of groups of layers vertically stacked on said graded semiconductor layer;
   each group of layers of said strained superlattice layer comprising a plurality of stacked base silicon monolayers defining a base silicon portion and a single oxygen monolayer constrained within a crystal lattice of adjacent base silicon portions from among the plurality of base silicon portions, wherein not all of the possible sites for oxygen atoms in the single oxygen monolayer are occupied by oxygen atoms; and
   non-superlattice regions for causing transport of charge carriers through said strained superlattice layer in a parallel direction relative to the stacked groups of layers, said non-superlattice regions comprising source and drain regions with said strained superlattice layer therebetween.

22. The semiconductor device of claim 21 further comprising a substantially ungraded semiconductor layer positioned between said stress layer and said strained superlattice layer.

23. The semiconductor device of claim 21 wherein said stress layer comprises graded silicon germanium.

24. The semiconductor device of claim 21 wherein said stress layer comprises a plurality of strain inducing pillars.

25. The semiconductor device of claim 21 further comprising an insulating layer positioned between said stress layers and said strained superlattice layer.

26. The semiconductor device of claim 21 further comprising a semiconductor substrate adjacent said stress layer on a side thereof opposite said strained superlattice layer.

27. A semiconductor device comprising:
a stress layer;
a strained layer above said stress layer and comprising a plurality of stacked base semiconductor portions and a single non-semiconductor monolayer constrained within a crystal lattice of adjacent base semiconductor portions from among the plurality of base semiconductor portions, wherein not all of the possible sites for non-semiconductor atoms in the single non-semiconductor monolayer are occupied by non-semiconductor atoms; and
non-superlattice regions for causing transport of charge carriers through said strained layer in a parallel direction relative to the stacked base semiconductor portions, said non-superlattice regions comprising source and drain regions with said strained layer therebetween.

28. The semiconductor device of claim 27 wherein said stress layer comprises a graded semiconductor layer.

29. The semiconductor device of claim 28 wherein said graded semiconductor layer is graded in a vertical direction; and wherein said strained layer is vertically stacked on said graded semiconductor layer.

30. The semiconductor device of claim 28 further comprising a substantially ungraded semiconductor layer positioned between said graded semiconductor layer and said strained layer.

31. The semiconductor device of claim 28 wherein said graded semiconductor layer comprises graded silicon germanium.

32. The semiconductor device of claim 27 wherein said stress layer comprises a plurality of strain inducing pillars.

33. The semiconductor device of claim 27 further comprising an insulating layer positioned between said stress layer and said strained layer.

* * * * *